United States Patent [19]
Morikawa

[11] Patent Number: 5,960,312
[45] Date of Patent: *Sep. 28, 1999

[54] PROCESS FOR FORMING A CONTACT ELECTRODE

[75] Inventor: Takafumi Morikawa, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/638,206

[22] Filed: Apr. 26, 1996

[30] Foreign Application Priority Data

May 2, 1995 [JP] Japan ................................. 7-131159

[51] Int. Cl.$^6$ ................................................ H01L 21/28
[52] U.S. Cl. ...................... 438/624; 438/533; 438/639; 438/696
[58] Field of Search .................................... 438/622, 623, 438/624, 637, 639, 696, 355 FOR, 522, 523, 530, 533

[56] References Cited

U.S. PATENT DOCUMENTS

| | | | |
|---|---|---|---|
| 4,641,420 | 2/1987 | Lee | 438/639 |
| 4,963,511 | 10/1990 | Smith | 438/639 |
| 5,066,612 | 11/1991 | Ohba et al. | 438/624 |
| 5,087,591 | 2/1992 | Teng | 438/639 |
| 5,194,404 | 3/1993 | Nagatomo | 438/655 |
| 5,422,308 | 6/1995 | Nicholls et al. | 438/233 |

FOREIGN PATENT DOCUMENTS 1-212451  8/1989  Japan .

OTHER PUBLICATIONS

Definition of "Then", The American Heritage Dictionary of the English Language, Third Edition, 1992, Houghton Mifflin, one page.

*Primary Examiner*—T. N. Quach
*Attorney, Agent, or Firm*—Ronald P. Kananen; Rader, Fishman & Grauer

[57] ABSTRACT

In the process for removing an insulating film formed at the surface where the semiconductor is exposed at the bottom of the contact with the progress of heat treatment for activation annealing of impurity doped to the semiconductor surface which has been executed after a multilayer insulating film is formed on a semiconductor substrate, a contact region is etched to form a contact aperture which reaches the semiconductor substrate and impurity is doped to the semiconductor substrate surface to form a protection film at the side wall of the aperture, it can be prevented that contact aperture is deformed and ohmic contact is no longer formed easily because the side wall of contact is etched ununiformly. Moreover, it can also be prevented that the contact is enlarged in size.

11 Claims, 6 Drawing Sheets

PROCESS FOR FORMING A CONTACT ELECTRODE

FIELD OF THE INVENTION

The present invention relates to a process for forming a contact in order to form a contact on a semiconductor substrate or a conductive layer such as a polycide layer.

BACKGROUND OF THE INVENTION

A contact of a semiconductor device has been formed in the manner as explained hereunder. After a multilayer insulating film is formed, for example, on a semiconductor substrate, a contact region is etched to form a contact aperture which reaches the semiconductor substrate. Thereafter, impurity is doped to the bottom of the aperture, in this case, to the surface of semiconductor substrate, by ion implantation and then heat processing is carried out for activation. In this case, an oxide film is formed by oxidation of the semiconductor substrate at the bottom of the aperture. Since this oxide film interferes electrical formation of ohmic contact, after this oxide film is removed by the light etching from the entire surface, conductor such as semiconductor or metal is buried to the aperture. Thereafter, the conductor buried in the aperture is connected to an interconnect layer formed at the upper layer by metal or polycide, etc.

The light etching explained above is performed using the isotropic wet etching which does not easily give damage to the underlayer semiconductor substrate. However, when a multilayer insulating film is stacked on the semiconductor substrate, shape of internal wall of the contact changes depending on difference of etching rates of respective layers of the multilayer film. Here, rises a problem that overhang of insulating film is generated when the etching rate of the upper insulating film is smaller than that of the lower insulating film, shape of contact is overhanged or when the etching rate of the intermediate insulating film is smaller than that of the lower insulating film, or cavity is generated in the intermediate layer due to the side etching when, on the contrary, the etching rate of the intermediate insulating film is larger than that of the upper and lower insulating films.

SUMMARY OF THE INVENTION

According to the first profile of the present invention, a method for forming a contact electrode comprises the steps of:

forming an aperture which reaches the semiconductor substrate to an interlayer insulating film covering the semiconductor substrate;

forming an impurity diffused region to the semiconductor substrate of the bottom of the formed aperture;

forming a protection film covering at least a side wall of the aperture and the impurity diffused region;

heat processing for activating impurity in the impurity diffused region; and removing the protection film covering the impurity diffused region.

According to the second profile of the present invention, a method for forming a contact electrode comprises steps of:

forming an aperture which reaches the conductive layer to the interlayer insulating film covering the conductive layer formed on the semiconductor substrate;

forming a protection film covering at least the side wall of the aperture and the conductive layer of the bottom; and removing the protection film covering the conductive layer at the bottom of the aperture after executing the predetermined processes (heat processing, ashing processing, etc.) required for formation of contact electrode.

As the protection film in the method for forming a contact electrode explained above, a silicon oxide film or silicon nitride film, for example, is used.

In the method for forming a contact electrode of a semiconductor device of the first profile of the present invention, since the impurity diffused region and side wall of the bottom of the aperture formed on the interlayer insulating film formed for the substrate contact are covered with the protection film and thereafter the heat processing is executed, the heat processing under the condition that impurity diffused region is exposed is avoided and formation of oxide film at the surface of the impurity diffused region can be suppressed. Moreover, thermal deformation of the side wall of the aperture is also suppressed.

In the method for forming a contact electrode of a semiconductor device of the second profile of the present invention, since the conductive layer and side wall of the bottom of the aperture formed on the interlayer insulating film for conductive layer contact are covered with a protection film and thereafter the predetermined processing required for formation of contact is executed, the heat processing under the condition that the conductive layer is exposed can be avoided and formation of the oxide film at the surface of the conductive layer can be suppressed. Moreover, thermal deformation of the side wall of the aperture can also be suppressed.

DETAILED DESCRIPTION OF THE PREFERRED EMBODIMENTS

A first method for forming a contact will be explained with reference to FIG. 1 to FIG. 3.

Figure 1:
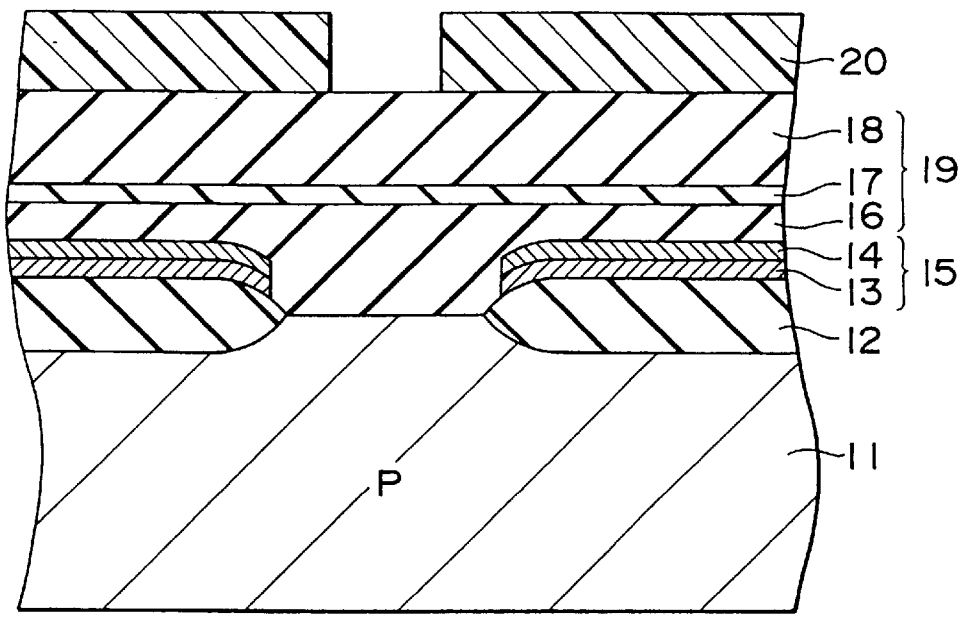
FIG. 1 to FIG. 3 are cross-sectional views of an element shown in the sequence of the processes of the first method for forming a contact of the semiconductor device.
Figure 2:
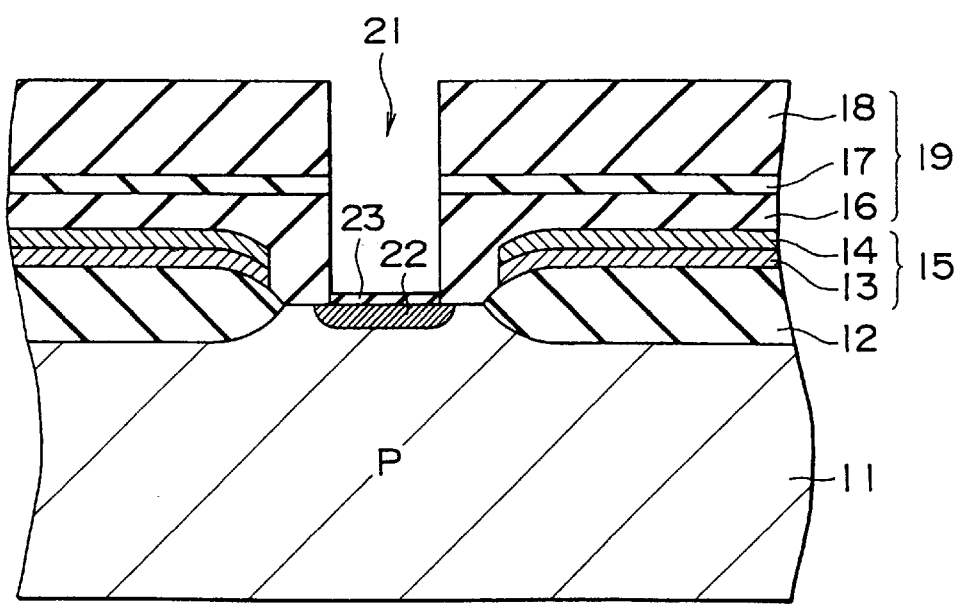

In FIG. 1, an interelement isolating film (silicon oxide film) 12 for defining element activating regions is formed on a p-type silicon substrate 11, while a polycide layer 15 formed by sequentially depositing the polycrystal silicon layer 13 and silicide layer 14 is arranged on the interelement isolating film 12.

The element activation region defined by the interelement isolating film 12 and polycide layer 15 are covered with an interlayer insulating layer 19 consisting of PSG (Phosphor Silicate Glass) film 16, silicon nitride film ($Si_3N_4$) 17 and BPSG (Boron Phosphor Silicate Glass) film 18. In such a configuration, in order to make contact with the silicon substrate 11 of the element activation region, the element activation region is coated, as shown in FIG. 1, with resist 20 to provide an aperture therein, thereafter etching is performed to form the aperture 21 as shown in FIG. 2. Next, after an impurity diffused region 22 is formed to the silicon substrate 11 at the bottom of the aperture 21 by the ion implantation process, the heat processing is executed for activating impurity. In this timing, the silicon substrate 11 at the bottom of the aperture 21 is oxidized to form an oxide film 23. This oxide film 23 provides disadvantage to formation of good ohmic contact and therefore this oxide film is removed by the light etching process. Thereafter, the aperture 21 is filled with metal such as aluminum and is then connected with a metal interconnect layer (not illustrated).

Figure 3:
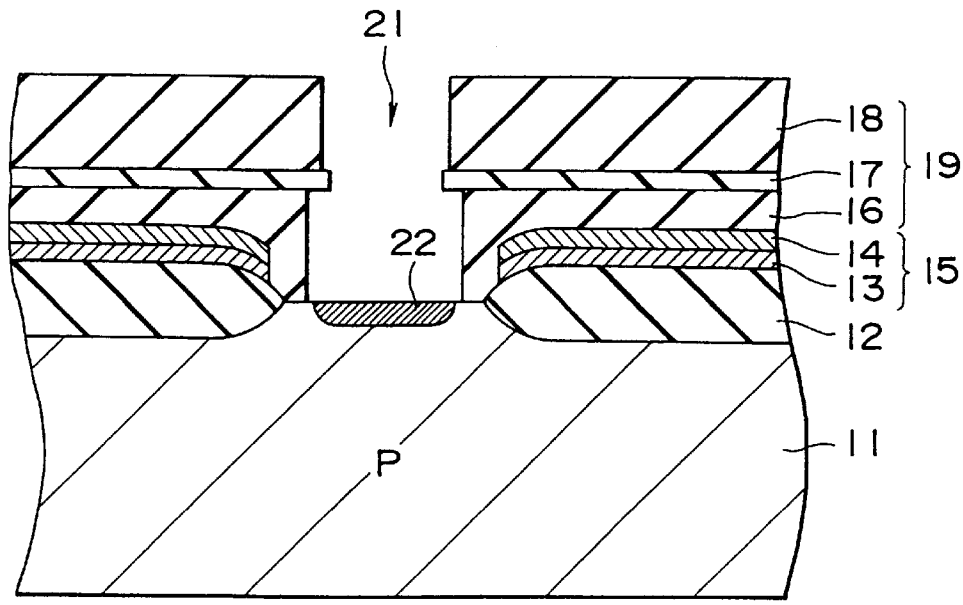

In the cleaning process for removing the oxide film 23 explained above, isotropic etching is performed, but since the aperture 21 is constituted with various kinds of films in different etching rates, the internal wall of the aperture 21 is deformed, for example, as shown in FIG. 3, by the cleaning process to deteriorate the shape of the contact, resulting in rise of contact resistance. Moreover, an aperture is enlarged at the the PSG film 16 where the etching rate is higher and thereby dielectric strength at the area between metal interconnect layer embedded in the aperture 21 and polycide layer 15 is lowered. In addition, the PSG film 16 and BPSG film 18 as the reflow films show fluidity due to the heat processing and then it is easily deformed. It is a factor for deteriorating shape of the contact.

Figure 4:
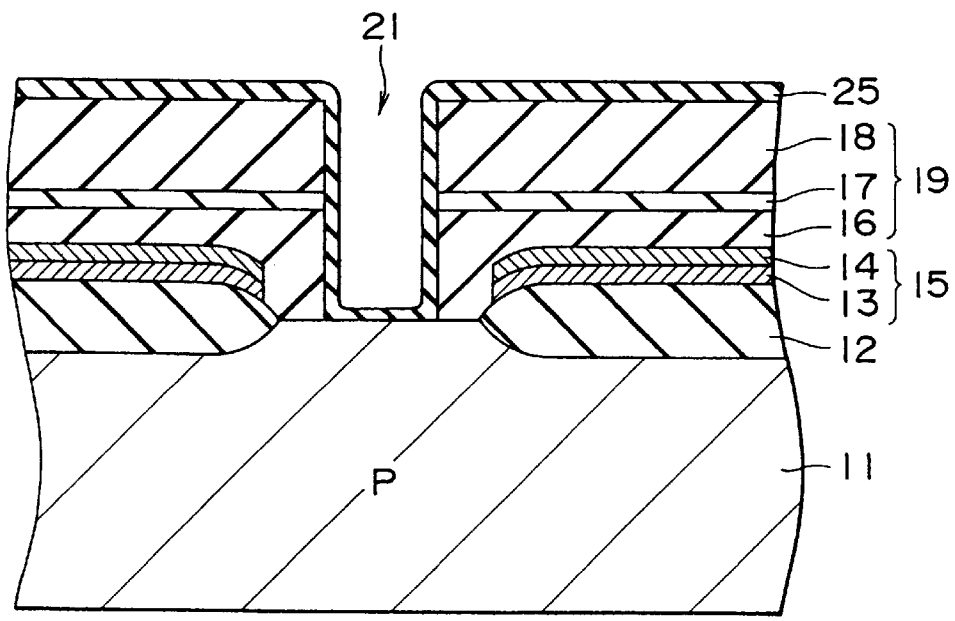
FIG. 4 to FIG. 7 are cross-sectional views of an element shown in the sequence of the processes of the second method for forming a contact of the semiconductor device.
Figure 5:
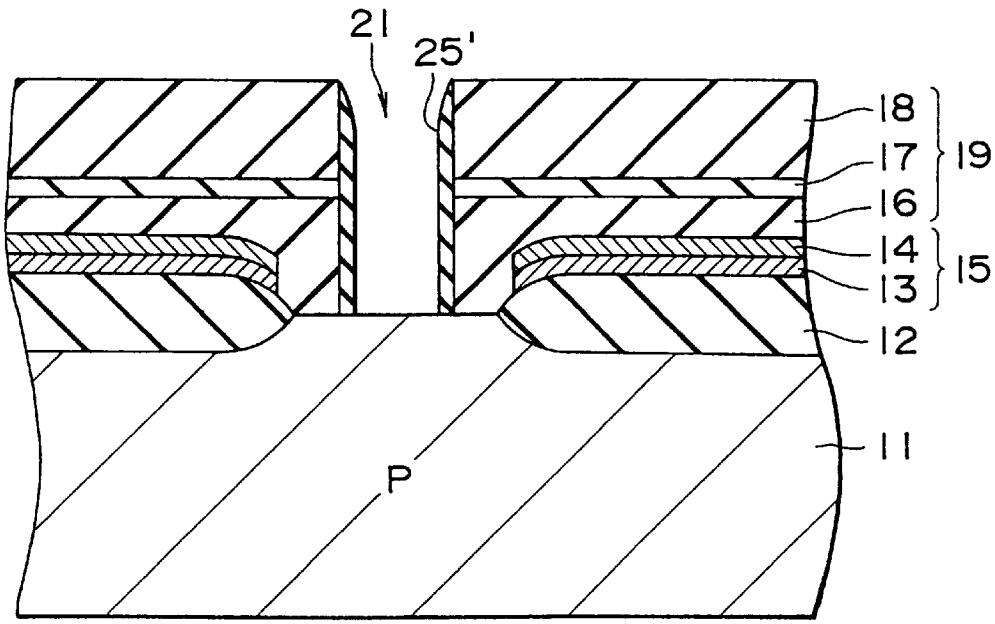
Figure 6:
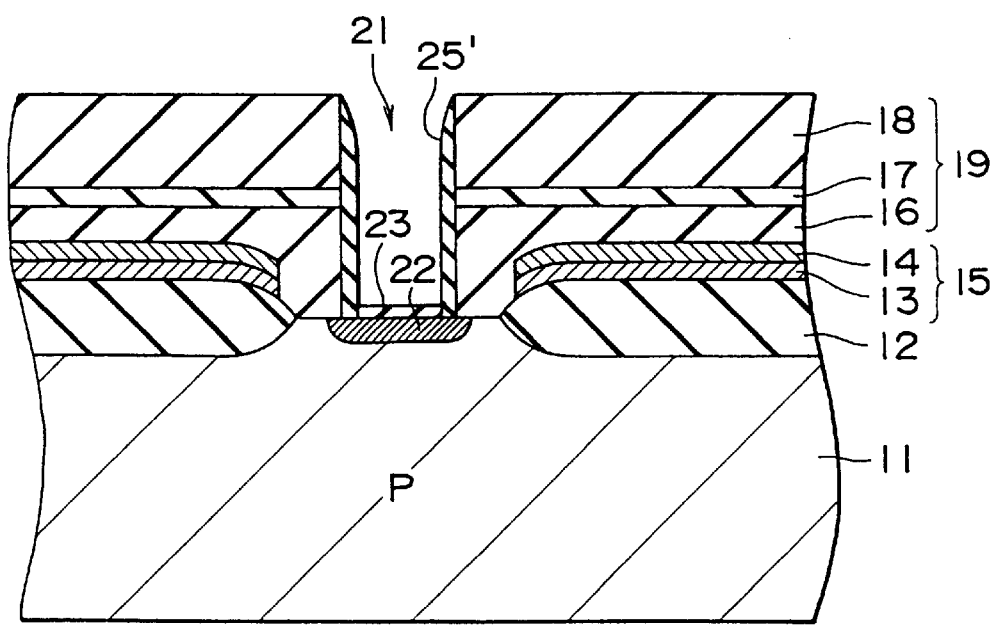

In order to solve such disadvantages as explained above, the second method for forming a contact shown in FIG. 4 to FIG. 7 includes the step for forming a protection side wall on the contact. That is, as shown in FIG. 4, immediately after the aperture 21 is formed, a silicon oxide film 25 as a protection film is formed to the entire surface including the side wall and bottom surface of the aperture 21 by means of the chemical vapor deposition (CVD), etc. Next, as shown in FIG. 5, only the silicon oxide film 25 of the bottom of the aperture 21 is removed by the anisotropic etching such as reactive ion etching (RIE) or the like to form a side wall 25' of the silicon oxide film 25. Then, as shown in FIG. 6, after an impurity diffused region 22 is formed on the silicon substrate 11 at the bottom of the aperture 21 by the ion implantation processing, the heat processing is performed to activate this impurity.

Figure 7:
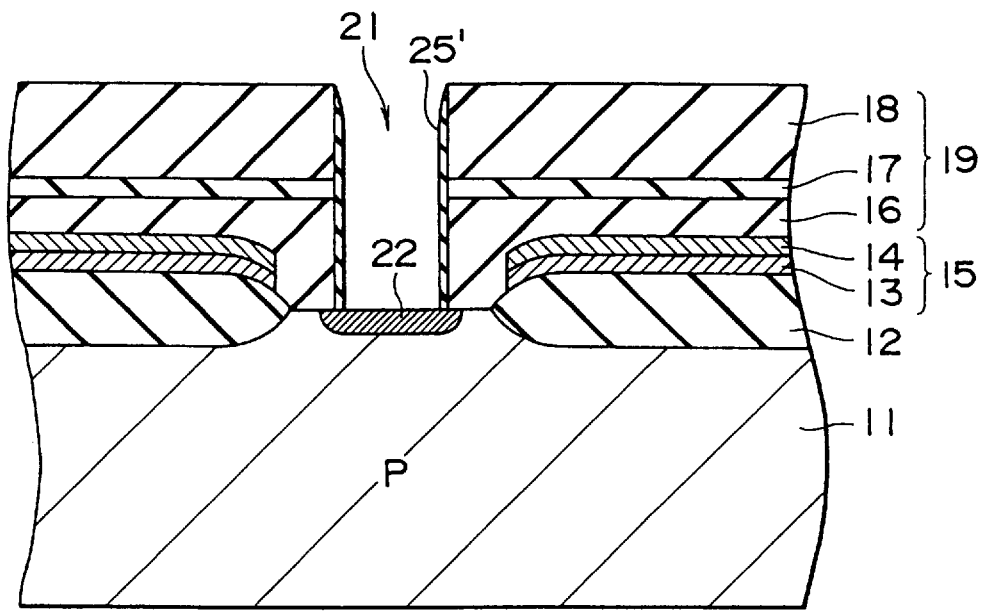

Also, in this case, since an oxide film 23 is formed as shown in FIG. 6 because the silicon substrate 11 at the bottom of the aperture 21, the oxide film 23 is removed as shown in FIG. 7 by the light etching process. Thereafter, the aperture 21 is filled with metal such as aluminum or the like and is then connected to a metal interconnect layer (not illustrated).

According to this method, since the side wall 25' at the internal wall surface of the aperture 21 is formed of single kind of film, the etching rate of the internal surface of the aperture 21 is uniform, deformation of internal wall of the aperture 21 can be prevented during the cleaning process for removing the oxide film 23 and moreover deformation of the PSG film 16 and PBSG film 18 during the heat processing can also be prevented. However, since sufficient etching is necessary for thorough removal of the oxide film 23 formed on the surface of the impurity diffused region 22 during the heat treatment, the side wall 25' is also etched in some cases, exposing the initial kind of film (PSG film 16, silicon nitride film 17, BPSG film 18). Therefore, in this case, the disadvantages explained above (that is, deformation of the internal wall surface of the aperture 21 and enlarged contact) cannot still be solved. Meanwhile, when light wet etching has been performed, oxide film 23 is left in some cases, resulting in the problem that contact resistance rises. Accordingly, the oxide film 23 must perfectly be removed while the side wall 25' is still left.

The preferred embodiments of the present invention will then be explained in detail with reference to the accompanying drawings.

Figure 8:
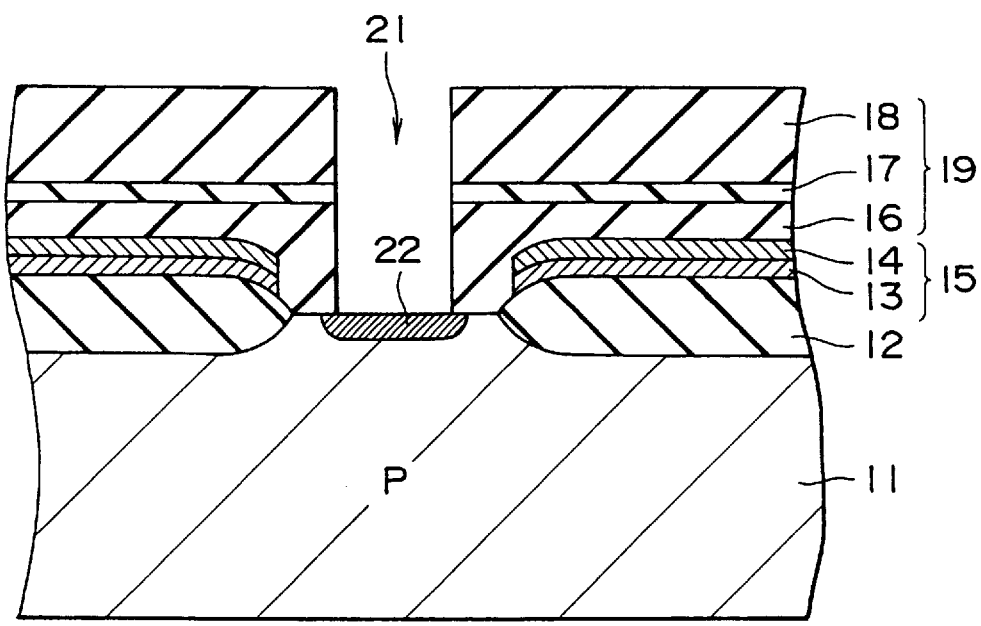
FIG. 8 to FIG. 10 are cross-sectional views of an element shown in the sequence of the processes of the third method for forming a contact of the semiconductor device.
Figure 9:
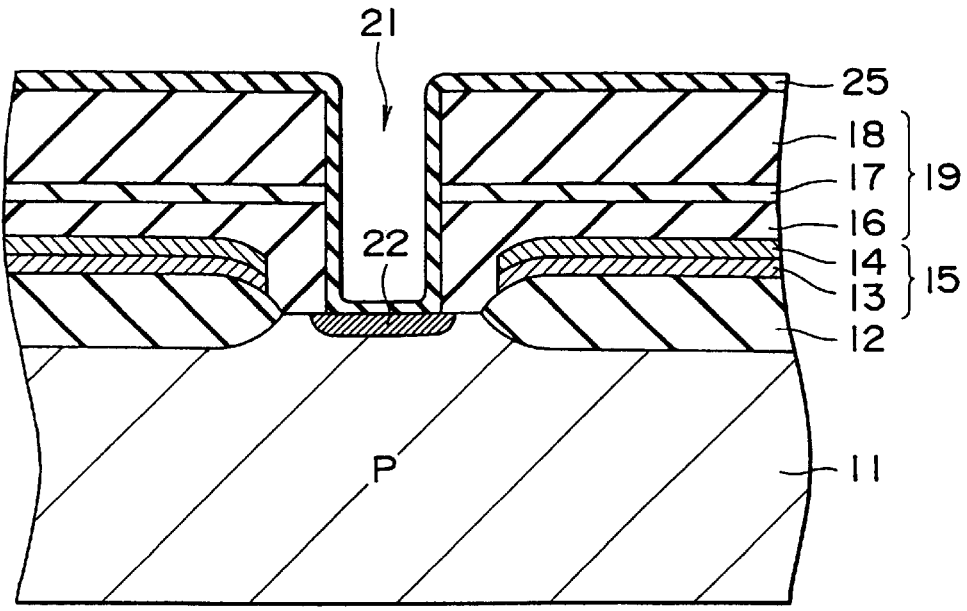
Figure 10:
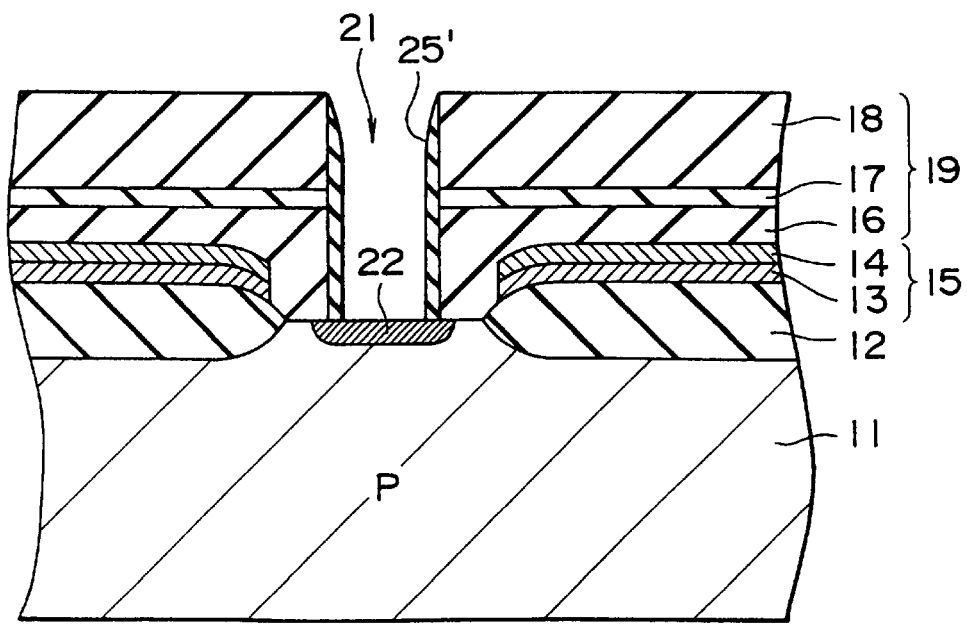

FIG. 8 to FIG. 10 are cross-sectional views for explaining the third method for forming a contact of the semiconductor device. The constitutional elements same as those of the first method are designated by the same reference numerals. In this embodiment, the processings up to the coating of resist on the interlayer insulating film 19 are not explained here because these are same as those in the first method.

As shown in FIG. 8, after the element activation region is coated with the resist 20 to have an aperture, etching is executed using the resist as mask to form an aperture 21, which reaches the silicon substrate 11, to the interlayer insulating layer 19. Next, an impurity diffused region 22 is formed to the silicon substrate 11 at the bottom of the aperture 21 by the ion implantation processing.

In this embodiment, as shown in FIG. 9, a silicon oxide film 25 is formed as the protection film covering the entire surface including the bottom surface and internal side wall of the aperture 21 and thereafter heat treatment is executed to activate impurity of the impurity diffused region 22. In this case, it is not observed, due to existence of the silicon oxide film 25 covering the bottom surface of the aperture 21, that the silicon substrate 11 is oxidized allowing formation of thick oxide film at the bottom of contact. Moreover, the interlayer insulating layer 19 shows fluidity in the temperature region of 800° C. to 850° C., but thermal deformation of the aperture 21 can be prevented due to existence of the silicon oxide film 25.

Next, as shown in FIG. 10, only the silicon oxide film 25 of the bottom of the aperture 21 is removed by the anisotropic dry etching such as RIE to form the side wall 25' at the internal wall surface of the aperture 21. Thereafter, light etching is executed. Subsequently, the aperture 21 is filled with metal such as aluminum and is then connected with a metal interconnect layer (not illustrated). Here, it can be seen in some cases that oxide film is formed slightly at the surface of the impurity diffused region 22 due to the natural oxidation under the normal temperature after the silicon oxide film 25 is removed from the bottom of the aperture 21 by means of the anisotropic etching such as RIE or the like, but such oxide film can easily be removed by extremely light wet etching.

As explained above, in this embodiment, since the heat treatment under the condition that the impurity diffused region 22 is exposed is avoided and the heat treatment is executed after the impurity diffused region 22 at the bottom of the aperture 21 and the surface of the interlayer insulating layer 19 of the internal wall surface are covered with the protection film, oxide film is almost not formed at the surface of the silicon substrate 11. Therefore, oxide film at the surface of silicon substrate can be removed only with extremely light wet etching. Accordingly, the side wall 25' formed at the internal wall surface of the aperture 21 is little etched by the light etching of the silicon substrate surface and thereby deformation of the contact shape by the light etching (that is, unevenness at the internal wall surface of the aperture 21) can be prevented. As a result, rise of contact resistance can also be suppressed. Since, enlargement of contact is naturally be prevented, dielectric strength for the polycide layer 15 can also be guaranteed. In addition, due to existence of the side wall 25', deformation of internal surface of the aperture 21 due to fluidity of the interlayer insulating layer 19 during the heat treatment can also be prevented giving much contribution to prevention of deterioration of the contact characteristics. Further, auto-doping phenomenon due to invasion of impurity under the atmosphere of heat treatment into the impurity diffused region 22 is effectively suppressed by existence of the protection film, also playing an important role for prevention of deterioration of the contact characteristics.

Figure 11:
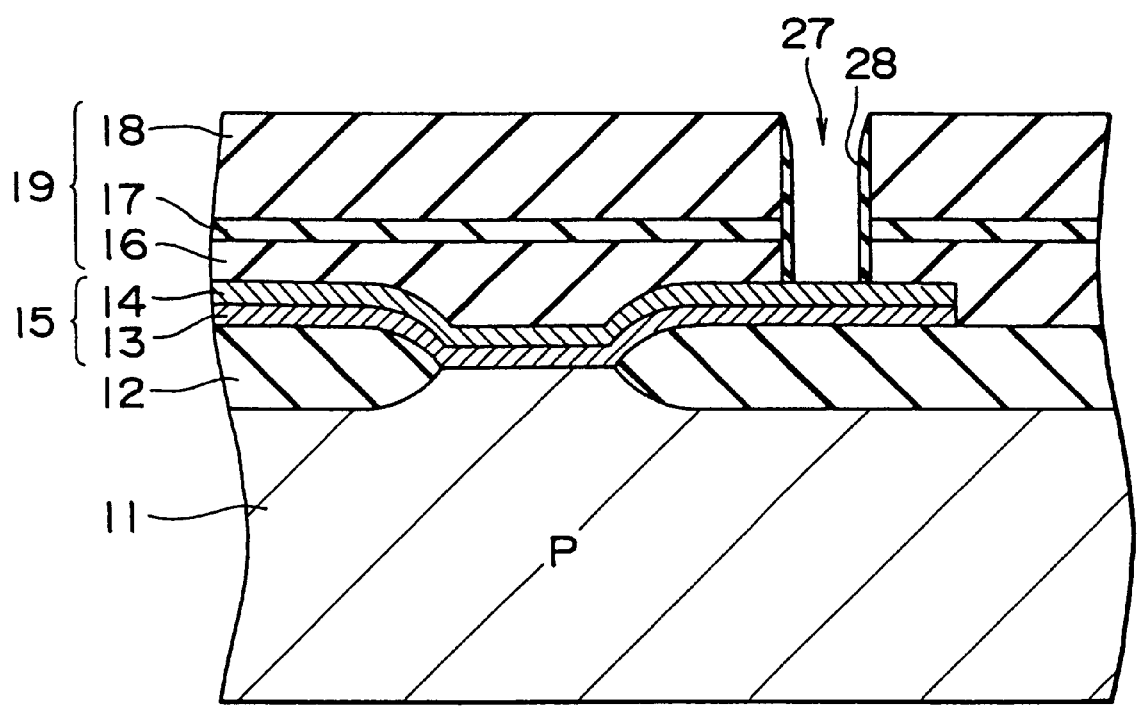
FIG. 11 is a cross-sectional view of an element showing the principal process of the fourth method for forming a contact of the semiconductor device.

The method explained above is not limited only to formation of the substrate contact and can also be applied, as shown in FIG. 11, to formation of the contact to the polycide layer 15. In FIG. 11, an aperture 27 which reaches the polycide layer 15 is formed to the interlayer insulating layer 19 covering 7 the polycide layer 15 on the interelement isolating film 12 and side wall 28' of the silicon oxide film is formed at the internal wall surface. In this case, the method for forming contact is similar to the embodiment explained above. That is, first an aperture 27 is formed by the etching using resist formed on the interlayer insulating layer 19 as the mask, silicon oxide film is formed on the entire part of the surface and thereafter the heat treatment is executed. Moreover, only the silicon oxide film is removed from the bottom of the aperture 27 by the anisotropic etching such as RIE or the like to form the side wall 28' at the internal wall surface of the aperture 27. Thereafter, the light etching is performed to fill the aperture 27 with metal such as aluminum and the aperture is then connected with a metal interconnect layer (not illustrated). In this embodiment, oxide film is also not formed on the polycide layer 15 at the bottom of the aperture 27 and only slight light etching is necessary. Therefore, the side wall 28' is not removed and sufficiently functions as the protection film which can sufficiently prevent deterioration of the contact shape.

It is still further effective to use an etching-free material as the protection film at the time of removing the silicon oxide film formed at the bottom of the aperture by means of the etching process. For example, as the insulating film, silicon nitride film is used and as the conductive film, semiconductor film such as polysilicon or the like and refractory metal such as Ti, TiON, TiN, W, Pt or the like may be used. Particularly when a refractory metal is used as the protection film, the protection film at the bottom of the contact is not always necessary and moreover when a metal interconnection such as aluminum is used as the upper layer metal interconnect layer, it can also work as the barrier metal which can prevent diffusion into the semiconductor substrate from the metal interconnection.

What is claimed is:

1. A process for forming a contact electrode of a semiconductor device comprising the combination of the following steps in order:

(1) forming, on a semiconductor substrate, an interlayer insulting film consisting of a plurality of laminated insulting layers with different etching characteristics;

(2) forming an aperture which reaches said semiconductor substrate in said interlayer insulating film;

(3) forming an impurity diffused region in said semiconductor substrate by depositing an impurity to an exposed region of said semiconductor substrate at the bottom of said aperture;

(4) forming a protection film consisting of an insulating material covering the side wall and bottom of said aperture;

(5) applying heat treatment to activate said impurity in said impurity diffused region; and (6) removing selectively the part covering the bottom of said aperture among said protection film.

2. The process for forming a contact electrode of a semiconductor device set forth in claim 1, wherein said protection film is silicon oxide film.

3. The process for forming a contact electrode of a semiconductor device set forth in claim 1, wherein said protection film is silicon nitride film.

4. Process for forming a contact electrode of a semiconductor device comprising the combination of the following steps in order:

(1) forming, on a semiconductor substrate, an interlayer insulting film consisting of a plurality of laminated insulting layers with different etching characteristics;

(2) forming an aperture which reaches said semiconductor substrate in said interlayer insulating film;

(3) forming an impurity diffused region in said semiconductor substrate by depositing an impurity to an exposed region of said semiconductor substrate at the bottom of said aperture;

(4) forming a protection film consisting of an conductive material covering the side wall and bottom of said aperture;

(5) applying heat treatment to activate said impurity in said impurity diffused region; and (6) removing selectively the part covering the bottom of said aperture among said protection film.

5. The process of forming a contact electrode of a semiconductor device set forth in claim 4, wherein said protection film is composed of refractory metal.

6. The process of forming a contact electrode of a semiconductor device set forth in claim 4, wherein said conductive material is composed of titanium, tungsten, platinum or a compound including such metal materials.

7. A process for forming a contact electrode of a semiconductor device having a polycide layer formed directly on a semiconductor substrate comprising the combination of the following steps in order:

(1) forming, on said polycide layer, an interlayer insulating film consisting of a plurality of laminated insulating layers with different etching characteristics;

(2) forming an aperture which reaches said polycide layer in said interlayer insulating film;

(3) forming a protection film covering the side wall and bottom of said aperture; and (4) removing selectively the part covering the bottom of said aperture among said protection film.

8. The process for forming a contact electrode of a semiconductor device set forth in claim 7, wherein said protection film is silicon oxide film.

9. The process for forming a contact electrode of a semiconductor device set forth in claim 7, wherein said protection film is silicon nitride film.

10. The process of forming a contact electrode of a semiconductor device set forth in claim 7, wherein said protection film is composed of refractory metal.

11. The process of forming a contact electrode of a semiconductor device set forth in claim 10, wherein said metal is titanium, tungsten, platinum or a compound including such metal materials.

* * * * *

UNITED STATES PATENT AND TRADEMARK OFFICE
CERTIFICATE OF CORRECTION

PATENT NO. : 5,960,312
DATED : September 28, 1999
INVENTOR(S) : Takafumi MORIKAWA It is certified that error appears in the above-identified patent and that said Letters Patent is hereby corrected as shown below:

Column 5, line 48, Claim 1, line 5, "insulting" should read

-- insulating --;

Column 5, line 49, Claim 1, line 6, "insulting" should read

-- insulating --;

Column 6, line 12, Claim 4, line 5, "insulting" should read

-- insulating --;

Column 6, line 12, Claim 4, line 6, "insulting" should read

-- insulating --; and

Column 6, line 15, Claim 4, line 8, "interlayer" should read

-- layer --.

Signed and Sealed this

Second Day of May, 2000

Attest:

Q. TODD DICKINSON

Attesting Officer

Director of Patents and Trademarks